(12) United States Patent
Kanayama et al.

(10) Patent No.: US 10,449,795 B2
(45) Date of Patent: *Oct. 22, 2019

(54) PRINTING PLATE, LAMINATED CERAMIC ELECTRONIC COMPONENT PRODUCING METHOD, AND PRINTER

(71) Applicant: Murata Manufacturing Co., Ltd., Kyoto-fu (JP)

(72) Inventors: Yoshihiro Kanayama, Nagaokakyo (JP); Hideo Tanabe, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/162,052

(22) Filed: Oct. 16, 2018

(65) Prior Publication Data

US 2019/0047311 A1   Feb. 14, 2019

Related U.S. Application Data

(62) Division of application No. 14/988,328, filed on Jan. 5, 2016, now Pat. No. 10,131,175.

(30) Foreign Application Priority Data

Jan. 9, 2015 (JP) ................................. 2015-003062
Sep. 1, 2015 (JP) ................................. 2015-172028

(51) Int. Cl.
*B41F 9/00* (2006.01)
*B41N 1/00* (2006.01)
(Continued)

(52) U.S. Cl.
CPC .................. *B41N 1/00* (2013.01); *B41F 9/00* (2013.01); *H01G 4/0085* (2013.01); *H05K 3/1275* (2013.01); *H01G 4/30* (2013.01)

(58) Field of Classification Search
CPC . B41F 9/00; B41F 9/063; B41F 13/11; B41N 1/00; B41N 1/06; B41N 9/00; H05K 3/1275; H01G 4/0085; H01G 4/30
See application file for complete search history.

(56) References Cited

U.S. PATENT DOCUMENTS 3,980,018 A    9/1976   Ichikawa
4,033,059 A    7/1977   Hutton et al.
(Continued)

FOREIGN PATENT DOCUMENTS

JP    2006-110916 A    4/2006
JP    4229043 B2       2/2009
(Continued)

OTHER PUBLICATIONS

An Office Action; "Notice of Reasons for Rejection," issued by the Japanese Patent Office on Feb. 20, 2018, which corresponds to Japanese Patent Application No. 2015-172028 and is related to U.S. Appl. No. 14/988,328.

*Primary Examiner* — Matthew G Marini
*Assistant Examiner* — Marissa Ferguson-Samreth
(74) *Attorney, Agent, or Firm* — Studebaker & Brackett PC

(57) ABSTRACT

A print pattern of a printing plate used in intaglio printing includes plural partition walls and a groove-shaped cell unit. The plural partition walls are continuously extended in a printing direction, and arranged at predetermined intervals in an orthogonal direction. The cell unit is formed between the partition walls adjacent to each other, and a printing paste (conductive paste) is retained in the cell unit. Plural printing direction walls that are arranged in a zigzag manner in the printing direction are coupled to each other by a (Continued)

coupling walls that are arranged in the printing direction walls adjacent to each other in the printing direction, thereby forming the partition wall.

11 Claims, 18 Drawing Sheets

(51) Int. Cl.
*H05K 3/12* (2006.01)
*H01G 4/008* (2006.01)
*H01G 4/30* (2006.01)

(56) References Cited

U.S. PATENT DOCUMENTS

| | | |
|---|---|---|
| 5,033,377 A | 7/1991 | Shimizu |
| 5,213,034 A | 5/1993 | Kuwahara et al. |
| 6,701,839 B1 | 3/2004 | Levy |
| 7,063,014 B2 | 6/2006 | Hashimoto et al. |
| 9,230,743 B2 | 1/2016 | Yoshida |
| 9,340,005 B2 | 5/2016 | Yoshida |
| 2004/0003734 A1 | 1/2004 | Shively et al. |
| 2007/0107611 A1 | 5/2007 | Takashima et al. |
| 2011/0162543 A1 | 7/2011 | Suzuki et al. |
| 2012/0168222 A1 | 7/2012 | Bartos et al. |

FOREIGN PATENT DOCUMENTS

| | | |
|---|---|---|
| JP | 2012-071533 A | 4/2012 |
| JP | 2012-131227 A | 7/2012 |
| JP | 5454440 B2 | 3/2014 |
| JP | 2014-128924 A | 7/2014 |

PRINTING PLATE, LAMINATED CERAMIC ELECTRONIC COMPONENT PRODUCING METHOD, AND PRINTER

CROSS-REFERENCE TO RELATED APPLICATIONS

This application is a Divisional of U.S. application Ser. No. 14/988,328 filed Jan. 5, 2016 and claims benefit of priority to Japanese Patent Application 2015-003062 filed Jan. 9, 2015, and to Japanese Patent Application No. 2015-172028 filed Sep. 1, 2015, the entire content of which is incorporated herein by reference.

TECHNICAL FIELD

The present disclosure relates to a printing plate for intaglio printing, a laminated ceramic electronic component producing method for printing a printing paste on one of a ceramic green sheet and a carrier film using the printing plate and forming a graphic pattern for forming an internal electrode, and a printer.

BACKGROUND

For example, as illustrated in FIG. 16, in a structure of a laminated ceramic capacitor that is of a typical laminated ceramic electronic component, internal electrodes 42a and 42b are laminated in a ceramic element 41 with a ceramic layer 43 interposed therebetween, and the internal electrodes 42a and 42b facing each other with the ceramic layer 43 interposed therebetween are alternately extended to end surfaces 44a and 44b located on opposite sides of the ceramic element 41, and connected to external electrodes 45a and 45b formed in the end surfaces 44a and 44b.

In producing the laminated ceramic capacitor having the above structure, ceramic green sheets in which the conductive paste is printed in a surface to form the internal electrode pattern are laminated, and the ceramic green sheets in which the internal electrode pattern is not formed are vertically laminated and contact-bonded on both sides of the laminated ceramic green sheets in which the internal electrode pattern is formed, thereby obtaining a laminated body. After the laminated body is fired, conductive paste is applied to both end surfaces of the fired laminated body (ceramic element), and glazed to form a pair of external electrodes.

Form the viewpoint of improving productivity, a gravure printing method is widely used as a method for printing the internal electrode pattern.

For example, as illustrated in FIG. 17, in the gravure printing method, a ceramic green sheet (article to be printed) 1 is passed between a gravure roll 151 and a back roll 154, and the conductive paste retained in a print pattern on the surface of the gravure roll 151 is transferred to the surface of the ceramic green sheet 1, whereby an internal electrode pattern (graphic pattern) 2 is printed on the ceramic green sheet 1.

In the gravure printing method, the printing plate in which the print pattern having a shape corresponding to the internal electrode pattern 2 to be printed is formed in an outer circumferential surface of the cylindrical gravure roll 151 is used, and the print pattern is constructed with plural cell units that are partitioned by walls such that a predetermined amount of conductive paste can surely be retained.

For example, JP 2006-110916 A discloses a printing plate. As illustrated in FIG. 18, a print pattern 111 of a printing plate 110 is constructed with plural partition walls 112 that are extended along a printing direction and a groove-shaped cell unit 115 that is formed between partition walls 112 adjacent to each other in a direction orthogonal to the printing direction. In transferring the conductive paste, thread-forming spinnability of the conductive paste is generated when the printing plate 110 and the ceramic green sheet 1 are separated from each other. The printing is performed while the thread-forming spinnability is generated along the partition wall 112.

SUMMARY

The partition wall 112 disclosed in JP 2006-110916 A includes a bent portion 112a, and the transfer of the conductive paste and behavior of the thread-forming spinnability in the bent portion 112a fluctuate due to characteristics (for example, viscosity) of the conductive paste, which results in a problem in that degradation of shape accuracy, unevenness or a thickness variation of the graphic pattern (internal electrode pattern) 2 formed by gravure printing is generated.

An object of the present disclosure is to provide a printing plate in which the shape accuracy, smoothness, and thickness homogeneity of the graphic pattern formed by printing the printing paste can be improved, a laminated ceramic electronic component producing method in which the printing plate is used, and a printer.

According to one aspect of the present disclosure, a printing plate for intaglio printing obtains a predetermined graphic pattern by printing a printing paste on an article to be printed. At this point, plural print patterns corresponding to a graphic pattern to be printed are formed in a surface of the plate material, a predetermined direction along the surface of the plate material is configured to correspond to a printing direction of the article to be printed, and each of the plural print patterns includes a partition wall and a groove-shaped cell unit, the partition wall includes a plurality of printing direction walls and a coupling wall, the plural printing direction walls being arranged in a zigzag manner in the printing direction, the partition wall including a coupling wall that is arranged so as to couple the printing direction walls adjacent to each other in the printing direction, the groove-shaped cell in which the printing paste is to be retained unit being provided on both sides of the partition wall.

According to another aspect of the present disclosure, a printing plate for intaglio printing obtains a predetermined graphic pattern by printing a printing paste on an article to be printed. At this point, plural print patterns corresponding to a graphic pattern to be printed are formed in a surface of the plate material, a predetermined direction along the surface of the plate material is configured to correspond to a printing direction of the article to be printed, and each of the plural print patterns includes plural partition walls and a groove-shaped cell unit, each of the partition wall including the plural printing direction walls and the coupling wall, the plural printing direction walls being arranged in a zigzag manner in the printing direction, the plural partition walls being arranged at predetermined intervals in a direction orthogonal to the printing direction, the coupling wall being arranged so as to couple the printing direction walls adjacent to each other in the printing direction, the groove-shaped cell unit in which the printing paste is to be retained being provided on both sides of the partition wall.

In the printing plate of the present disclosure, preferably the plural printing direction walls are arranged parallel to each other at predetermined intervals in the direction orthogonal to the printing direction.

Accordingly, the thread-forming spinnability generated by each partition wall can be generated in parallel at predetermined intervals, and the smoothness and thickness homogeneity of the graphic pattern can be improved.

Preferably the printing plate further includes plural end projection walls that are formed at at least one of the ends in the direction orthogonal to the printing direction.

For example, the end projection walls are arranged at the same position as the coupling wall along the printing direction or the end projection walls are arranged so as to face the end projection walls that face the end in the direction orthogonal to the printing direction in the printing direction walls arranged in the zigzag manner, which allows a periodical change amount of a cell width to be increased at the end along the printing direction. Resultantly, the transfer can stably be performed by continuously generating the thread-forming spinnability at a place where the cell width varies.

In the printing plate of the present disclosure, preferably the plate material is a cylindrical gravure roll, and a surface of the plate material is an outer circumferential surface of the gravure roll.

Because the printing plate of the present disclosure is constructed as a gravure printing plate, the shape accuracy, smoothness, and thickness homogeneity of the graphic pattern can be improved, and the speed of the printing performed on the article to be printed can be enhanced.

In the printing plate of the present disclosure, preferably the printing plate is a planographic printing plate in which the print pattern is formed in a flat plate material.

The shape accuracy, smoothness, and thickness homogeneity of the graphic pattern can be improved even in the case that the printing plate of the present disclosure is constructed as a flat printing plate.

In the printing plate of the present disclosure, preferably the printing plate is an offset printing plate in which the printing paste is printed on the article to be printed from the printing plate through an intermediate transfer body.

The shape accuracy, smoothness, and thickness homogeneity of the graphic pattern can be improved even in the case that the printing plate of the present disclosure is used in offset printing.

In the printing plate, preferably a cell width that is of a size in the direction orthogonal to the printing direction of the cell unit varies periodically along the printing direction.

Accordingly, the printing paste can surely be supplied from the cell unit to the partition wall, and the thread-forming spinnability can surely be generated in the partition wall to improve the smoothness and thickness homogeneity of the graphic pattern.

In the printing plate, preferably a main part of the printing direction wall is configured to be parallel to the printing direction.

Accordingly, a disturbance of the thread-forming spinnability state can be suppressed to surely generate the thread-forming spinnability along the printing direction wall, and the smoothness and thickness homogeneity of the graphic pattern can be improved.

In the printing plate, preferably the coupling wall is formed such that a minor angle in angles formed by a center line of the coupling wall and a center line of the adjacent printing direction wall is greater than 90° and less than 180° in a plan view.

Accordingly, the thread-forming spinnability is allowed to proceed gently, and the smoothness and thickness homogeneity of the graphic pattern can be improved.

In the printing plate, preferably a notch that communicates the cell units partitioned by the printing direction wall is formed in a part of the printing direction wall.

Accordingly, a contact area between an edge portion of the printing direction wall and the printing paste can be enlarged to increase an amount of printing paste supplied onto the printing direction wall. Resultantly, the thread-forming spinnability can surely be generated to improve the smoothness and thickness homogeneity of the graphic pattern.

In the printing plate, preferably a height of at least one of the printing direction wall and the coupling wall is lower than a height of the outer circumferential surface of the gravure roll.

Accordingly, the printing paste supplied onto the printing direction wall or coupling wall, in which a height is lowered, is pressed against the article to be printed, and a transfer amount of printing paste can be increased. Resultantly, generation of printing failure such as a defect of transferred colorant can be suppressed.

According to still another aspect of the present disclosure, a laminated ceramic electronic component producing method includes the step of printing a conductive paste as a printing paste on one of a ceramic green sheet and a carrier film using the printing plate and forming a graphic pattern for forming an internal electrode.

According to yet another aspect of the present disclosure, a printer includes the printing plate.

In the printing plate for intaglio printing of one aspect of the present disclosure, the print pattern includes the partition wall and the groove-shaped cell unit, the partition wall including the plural printing direction walls and the coupling wall, the plural printing direction walls being arranged in the zigzag manner in the printing direction, the coupling wall being arranged so as to couple the printing direction walls adjacent to each other in the printing direction, the printing pastes being retained on both sides of the partition wall in the groove-shaped cell unit. Therefore, when the printing plate separates from the article to be printed, the printing paste thread-forming spinnability generated between the partition wall and the article to be printed can continuously be generated along the partition wall to improve the shape accuracy, smoothness, and thickness homogeneity of the graphic pattern.

Because the print pattern includes the partition wall, the printing plate can be provided so as to form the small-size graphic pattern having excellent shape accuracy, smoothness, and thickness homogeneity.

In the printing plate for intaglio printing of another aspect of the present disclosure, the print pattern includes the plural partition walls and the groove-shaped cell unit, each of the plural print patterns includes plural printing direction walls and a coupling wall, the plural printing direction walls being arranged in the zigzag manner in the printing direction, the plurality of partition walls being arranged at predetermined intervals in a direction orthogonal to the printing direction, each of the plurality of partition walls including a coupling wall that is arranged so as to couple the printing direction walls adjacent to each other in the printing direction, the printing paste formed between the partition walls adjacent to each other being retained in the direction orthogonal to the printing direction in the cell unit. Therefore, when the printing plate separates from the article to be printed, the printing paste thread-forming spinnability generated between the partition wall and the article to be printed can continuously be generated along the partition wall to improve the shape accuracy, smoothness, and thickness homogeneity of the graphic pattern.

The partition walls are included at predetermined intervals in the direction orthogonal to the printing direction, so that the partition walls adjacent to each other in the orthogonal direction or the pieces of thread-forming spinnability generated near the partition wall can be prevented from interfering with each other.

The laminated ceramic electronic component producing method of still another aspect of the present disclosure includes the step of printing the conductive paste as the printing paste on one of the ceramic green sheet and the carrier film using the printing plate and forming the graphic pattern for forming an internal electrode. Therefore, the high-reliability laminated ceramic electronic component provided with the internal electrode having the homogeneous thickness and high shape accuracy can efficiently be produced.

Because the printer of still another aspect of the present disclosure includes the printing plate, the graphic pattern having excellent shape accuracy and homogeneous thickness can efficiently be formed by printing the printing paste using the printer.

DETAILED DESCRIPTION

Hereinafter, an exemplary embodiment of the present disclosure will be described in detail. In the following embodiments, a gravure roll is used as the printing plate for intaglio printing by way of example.

(First Embodiment)

Figure 1A:
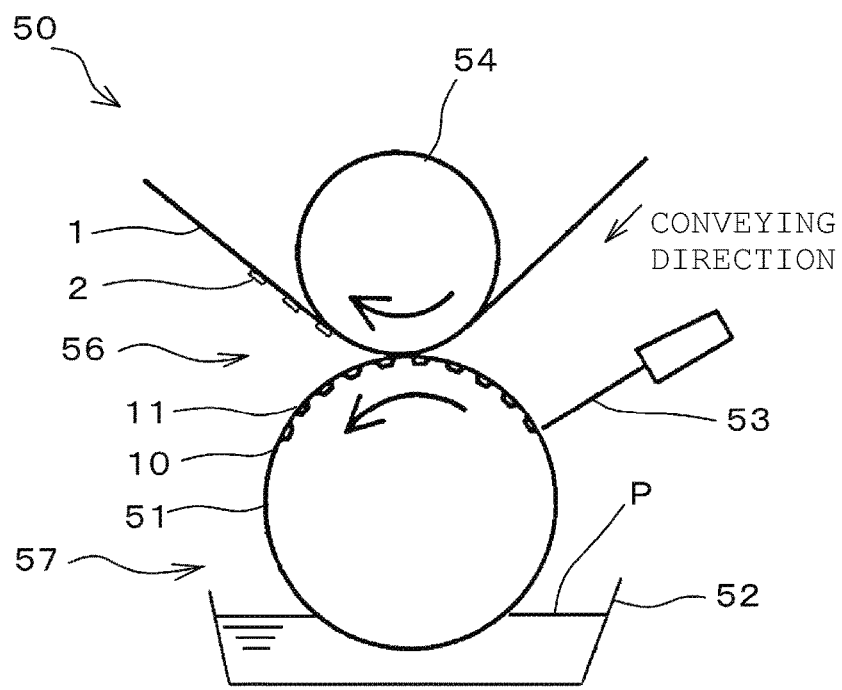
FIG. 1A is a schematic front view illustrating a configuration of a printer according to a first embodiment of the present disclosure.
Figure 1B:
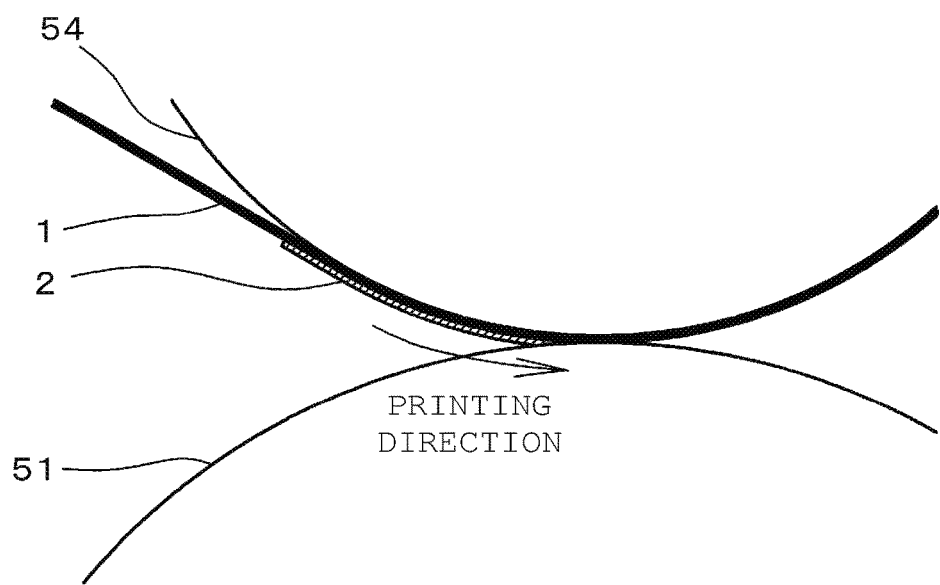
FIG. 1B is an enlarged view illustrating a main part of the printer of the first embodiment.
Figure 2:
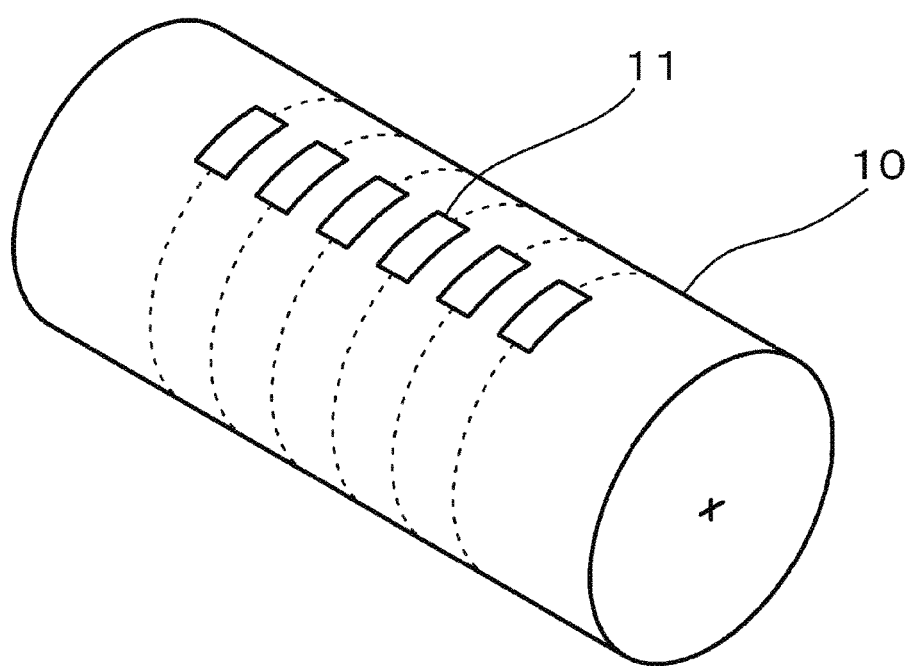
FIG. 2 is a view illustrating a gravure roll used in the printer of FIG. 1.

FIG. 1 is a view illustrating a schematic configuration of a printer using the printing plate according to a first embodiment of the present disclosure, and FIG. 2 is a perspective view illustrating a gravure roll used in the printer of FIG. 1.

A printer 50 of the first embodiment is used to print a conductive paste (printing paste) P for forming an internal electrode pattern on a ceramic green sheet 1 during a process of producing a laminated ceramic capacitor.

As illustrated in FIGS. 1 and 2, the printer 50 includes a gravure roll 51 in which plural print patterns 11 are included in a surface, a paste tank 52 in which the conductive paste P is stored, a scraping unit (blade) 53 that scrapes the excess conductive paste P adhering to the gravure roll 51, a back roll (impression cylinder) 54, and a conveying unit (not illustrated), such as a conveying roll, which conveys the ceramic green sheet (an article to be printed) 1.

The back roll 54 presses the ceramic green sheet 1 against the gravure roll 51, and a portion that transfers the conductive paste P to the ceramic green sheet 1 constitutes a transfer unit 56 in the printer 50 of the present disclosure.

The ceramic green sheet 1 is passed between the gravure roll 51 and the back roll 54, and the conductive paste P retained in the print pattern 11 in the surface of the gravure roll 51 is transferred to the surface of the ceramic green sheet 1, whereby an internal electrode pattern (graphic pattern) 2 can be printed on the ceramic green sheet 1.

The gravure roll 51 is dipped in the conductive paste P stored in the paste tank 52, thereby supplying the conductive paste P to the gravure roll 51. The paste tank 52 and a mechanism (not illustrated) that dips the gravure roll 51 constitute a paste supplying unit 57 in the printer 50 of the present disclosure.

As described above, the ceramic green sheet 1 on which the internal electrode pattern 2 is printed is laminated, contact-bonded, and fired, and an external electrode is formed to produce a laminated ceramic capacitor. Alternatively, the conductive paste is printed on the carrier film, and the printed conductive paste may be transferred to the ceramic green sheet to form the internal electrode pattern.

The cylindrical gravure roll 51 is used as a plate material, and the plural print patterns 11 corresponding to internal electrode patterns 2 to be printed are arranged in an outer circumferential surface of the gravure roll 51, thereby forming a printing plate 10 used in the intaglio printing. The printing plate 10 is configured such that a direction (circumferential direction) along the outer circumferential surface of the gravure roll 51 is matched with a printing direction of the internal electrode pattern 2.

Figure 3:
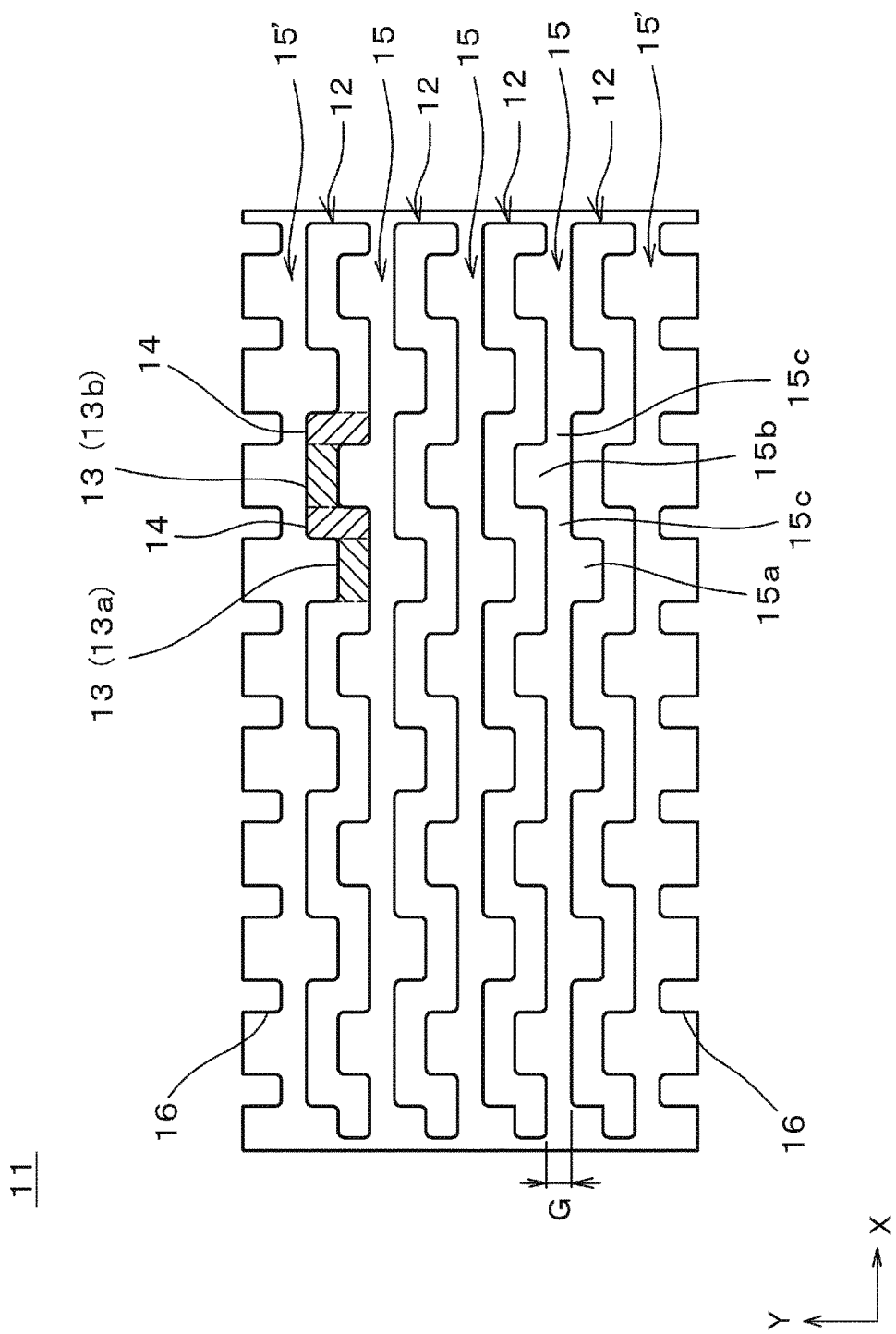
FIG. 3 is a development view illustrating a first example of a print pattern of a printing plate of the first embodiment of the present disclosure.
Figure 4:
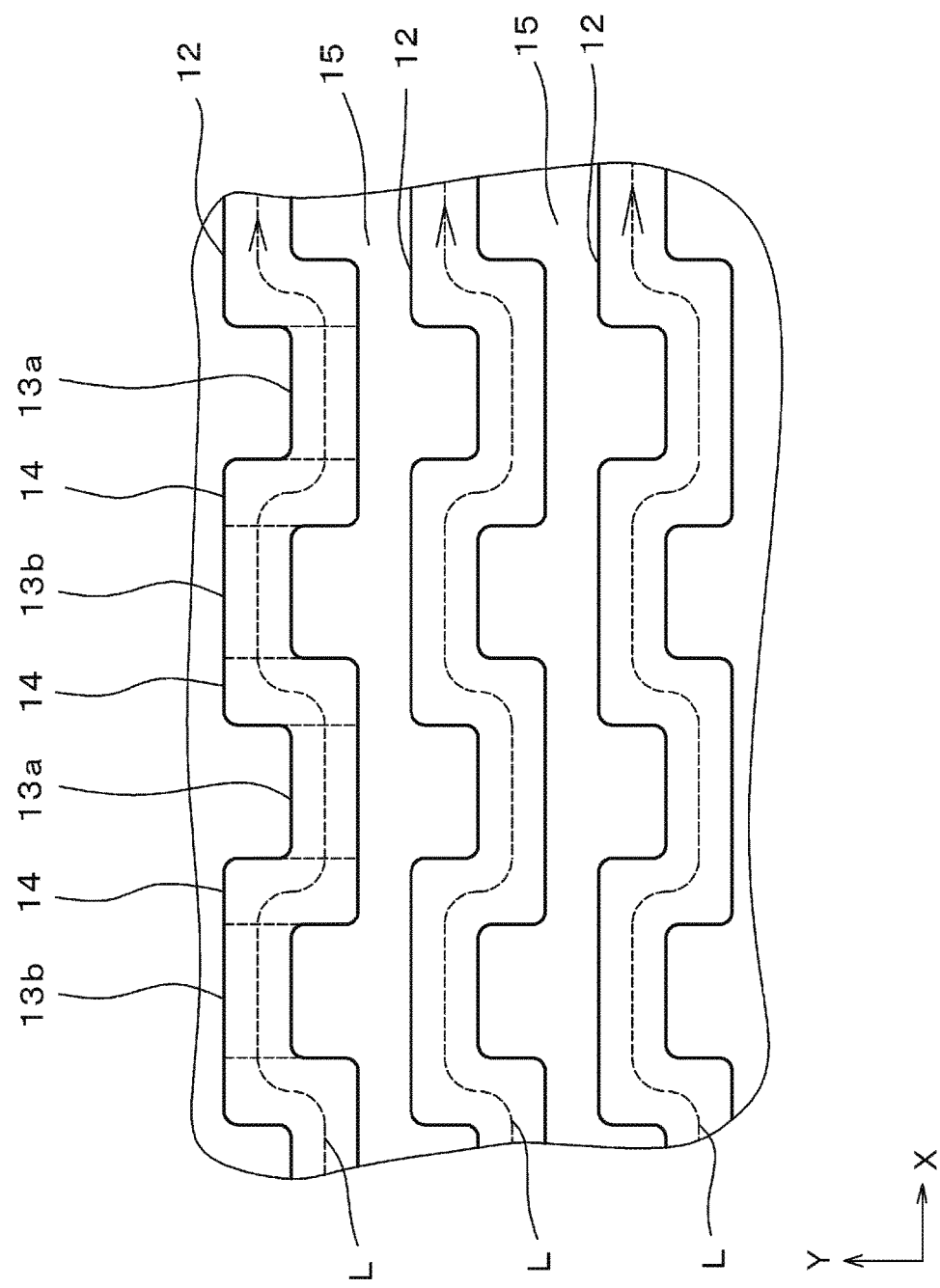
FIG. 4 is a partially enlarged view of the print pattern in FIG. 3.

As illustrated in FIGS. 3 and 4, the print pattern 11 includes plural partition walls 12 having rectangular pulse wave shape, a groove-shaped cell unit 15, and plural end projection walls 16. The plural partition walls 12 are provided continuously and extended in a printing direction X that is of an opposite direction to the conveying direction of the ceramic green sheet 1, and the plural partition walls 12 are arranged at predetermined intervals in an orthogonal direction Y. The cell unit 15 is formed between the partition walls 12 that are adjacent to each other in a direction (orthogonal direction) Y orthogonal to the printing direction X. The plural end projection walls 16 are formed at both ends in the orthogonal direction Y in the print pattern 11.

A groove-shaped cell unit 15' is also formed between the partition wall 12 and the end projection wall 16.

The partition wall 12 includes plural printing direction walls 13 that are arranged in a zigzag manner in the printing direction X and a coupling wall 14 that are arranged so as to couple the printing direction walls 13 adjacent to each other in the printing direction X.

That is, in the plural printing direction walls 13 that are arranged in the zigzag manner in the printing direction X while center lines of the printing direction walls 13 are parallel to the printing direction X, the printing direction walls 13 (13a and 13b) adjacent to each other in the printing direction X are coupled to each other by the coupling wall 14 in which the center line is parallel to the orthogonal direction Y, thereby forming the partition wall 12. A main part of the printing direction wall 13 is constructed with a linear portion parallel to the printing direction X.

In the partition wall 12, a branching wall projected in the orthogonal direction Y with the printing direction wall 13 as a base end or a branching wall projected in the printing direction X with the coupling wall 14 as a base end may be formed to an extent in which the branching wall does not obstruct the thread-forming spinnability of the conductive paste P.

Plural section cells 15a, 15b, and 15c sectioned by the printing direction wall 13 and the coupling wall 14 are continuously provided in the printing direction X to form the groove-shaped cell unit 15.

A width (a cell width that is of a size in the orthogonal direction Y) of the cell unit 15 varies periodically along the printing direction X so as to correspond to a disposition period of the printing direction wall 13 and coupling wall 14. That is, an amount of conductive paste P retained by the cell unit 15 varies in the printing direction X.

In the first embodiment, setting values and printing conditions of the printer 50, conductive paste P, and printing plate 10 are as follows.

Gravure roll diameter: 30 mm~300 mm
Printing speed: 5 m/min~150 m/min
Print pattern size: at least 0.5 mm in the printing direction, and 0.05 mm in the orthogonal direction
Width of wall in the printing direction (size in the orthogonal direction): 1 µm~25 µm
Width of coupling wall (size in the printing direction): 1 µm~25 µm
Nearest-neighbor interval G between the partition walls in the orthogonal direction: 5 µm
Partition wall height: flush with the outer circumferential surface of the gravure roll
Cell unit depth: 1 µm~100 µm A state of the conductive paste P transferred with the printing plate 10 having the above configuration, particularly the thread-forming spinnability of the conductive paste P that is generated in separating the printing plate 10 from the ceramic green sheet (article to be printed) 1 will be described below.

In transferring the conductive paste P with the printing plate 10, the thread-forming spinnability of the conductive paste P is mainly generated along the partition wall 12 with a locus indicated by a broken line L in FIG. 4 so as to proceed forward (the direction of an arrow X) in the printing direction X. Resultantly, disturbance of the thread-forming spinnability is hardly generated, and the transfer is stably performed.

The cell width of the groove-shaped cell unit 15 is configured to vary periodically along the printing direction X, and the thread-forming spinnability is generated at each point where the cell width varies. Therefore, the continuous thread-forming spinnability is stably generated, and the transfer is stably performed.

Because the partition walls 12 adjacent to each other in the orthogonal direction Y are provided at predetermined intervals in the direction orthogonal to the printing direction, the pieces of thread-forming spinnability generated by the partition walls 12 adjacent to each other in the orthogonal direction can be prevented from contacting and interfering with each other, and the transfer is stably performed.

The shape accuracy, smoothness, and thickness homogeneity of the graphic pattern 2 formed in the article to be printed 1 can be improved by the above configuration.

In the printing plate 10 of the first embodiment, the print pattern 11 includes the partition wall 12 in which the coupling wall 14 is arranged in parallel to the orthogonal direction Y. Alternatively, the print pattern 11 including the partition wall 12 in FIGS. 5 and 6 may be used.

Hereinafter, the identical or equivalent component is designated by the same numeral as that in FIG. 3.

Figure 5:
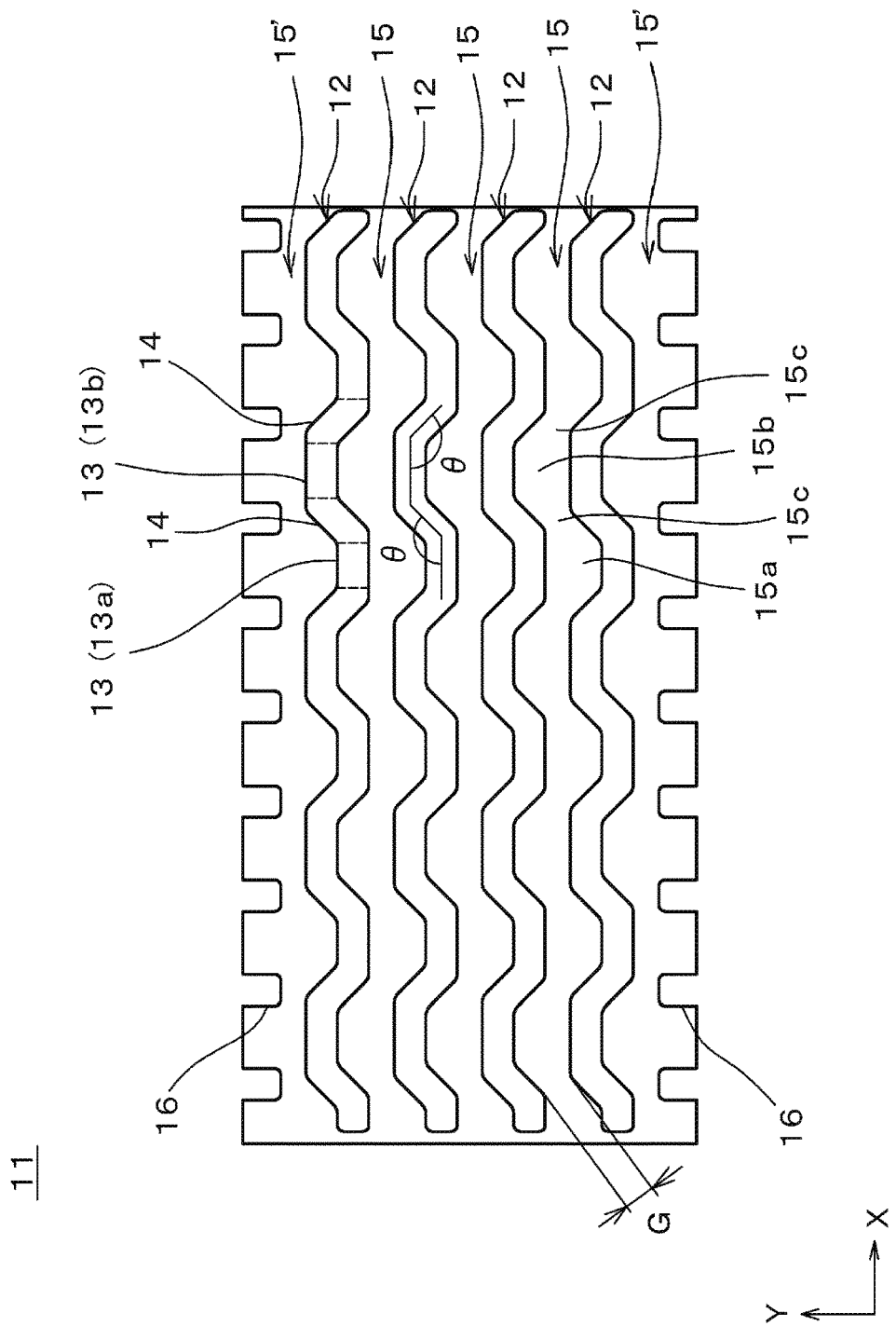
FIG. 5 is a view illustrating a second example of the print pattern of the printing plate of the first embodiment of the present disclosure.

In the print pattern 11 of FIG. 5, the coupling wall is formed such that a minor angle θ in angles formed by the center line of the extended direction of the coupling wall 14 and the center line of the extended direction of the printing direction wall 13 is greater than 90° and less than 180° (in FIG. 5, minor angle θ=135°) in a plan view.

The coupling wall 14 is linearly formed so as to couple an end on a front side of the printing direction wall 13a and an end on a rear side of the printing direction wall 13b, the printing direction wall 13a and the printing direction wall 13b being adjacent to each other in the printing direction X.

Figure 6:
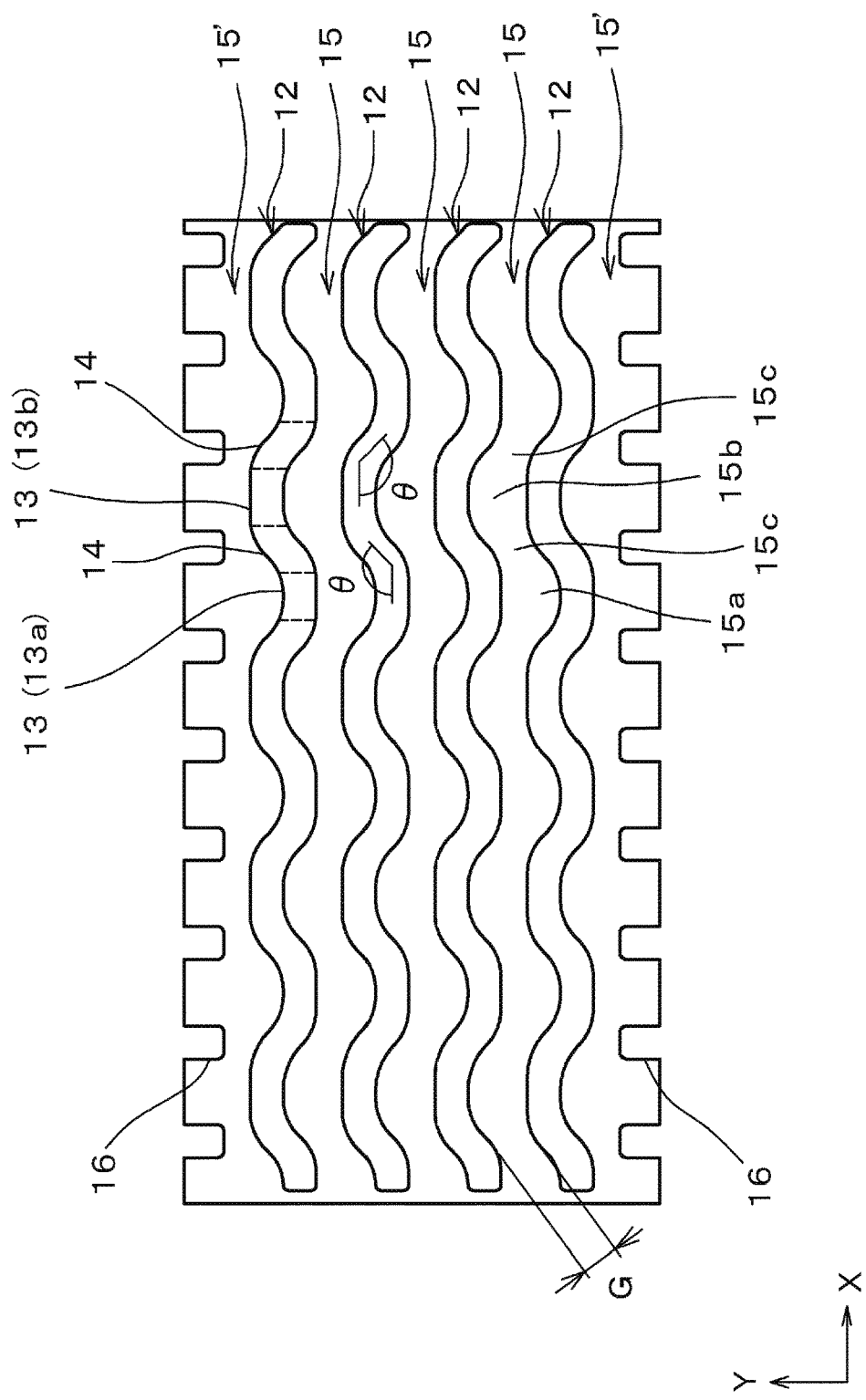
FIG. 6 is a view illustrating a third example of the print pattern of the printing plate of the first embodiment of the present disclosure.

In the print pattern 11 of FIG. 6, the coupling wall 14 that couples the end on the front side of the printing direction wall 13a and the end on the rear side of the printing direction wall 13b is formed into a smoothly curved shape, the printing direction wall 13a and the printing direction wall 13b being adjacent to each other in the printing direction X. The coupling wall 14 of FIG. 6 is also formed such that the minor angle in the angles formed by a tangent of the center line of the extended direction of the coupling wall 14 and the center line of the extended direction of the printing direction wall 13 is greater than 90° and less than 180°.

In the configurations of FIGS. 5 and 6, the thread-forming spinnability is caused to proceed gently on the coupling wall 14, and the thread-forming spinnability can continuously and stably be maintained. Compared with the configuration in FIG. 3, a nearest distance (nearest interval) G between the partition walls 12 adjacent to each other in the direction orthogonal to the printing direction increases, and the pieces of thread-forming spinnability generated by the adjacent partition walls 12 can be prevented from contacting and interfering with each other.

Figure 7:
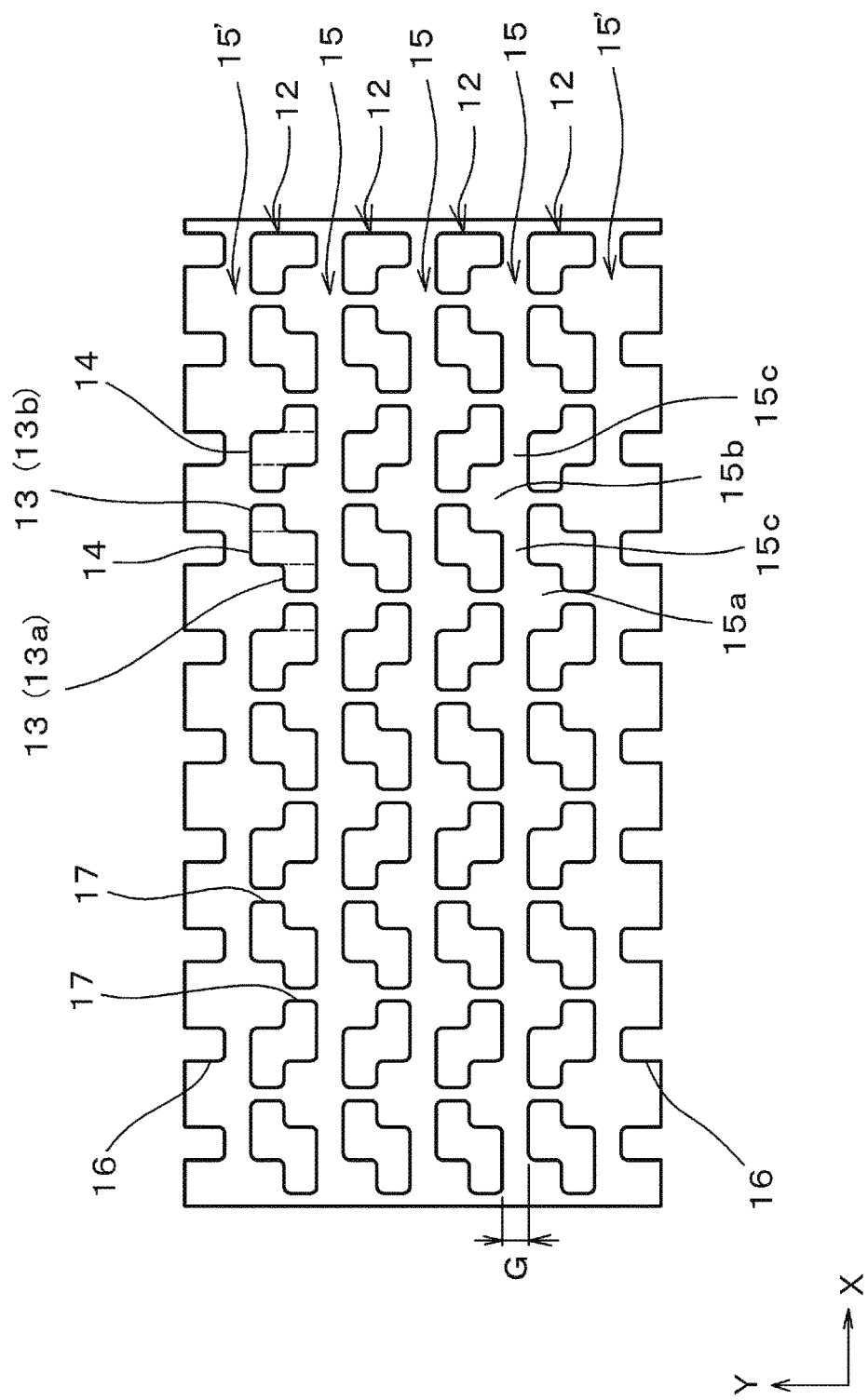
FIG. 7 is a view illustrating a fourth example of the print pattern of the printing plate of the first embodiment of the present disclosure.
Figure 8:
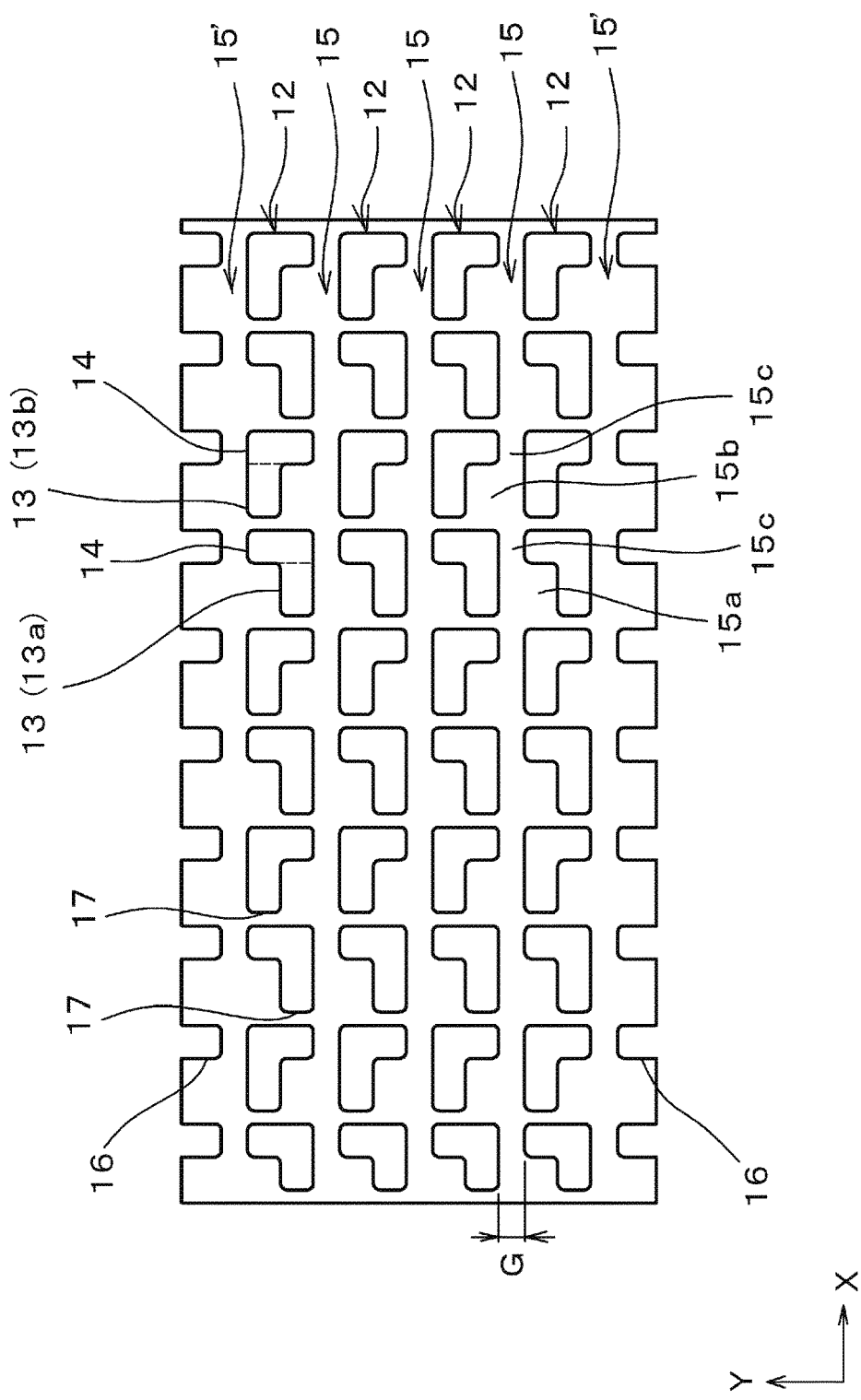
FIG. 8 is a view illustrating a fifth example of the print pattern of the printing plate of the first embodiment of the present disclosure.
Figure 9:
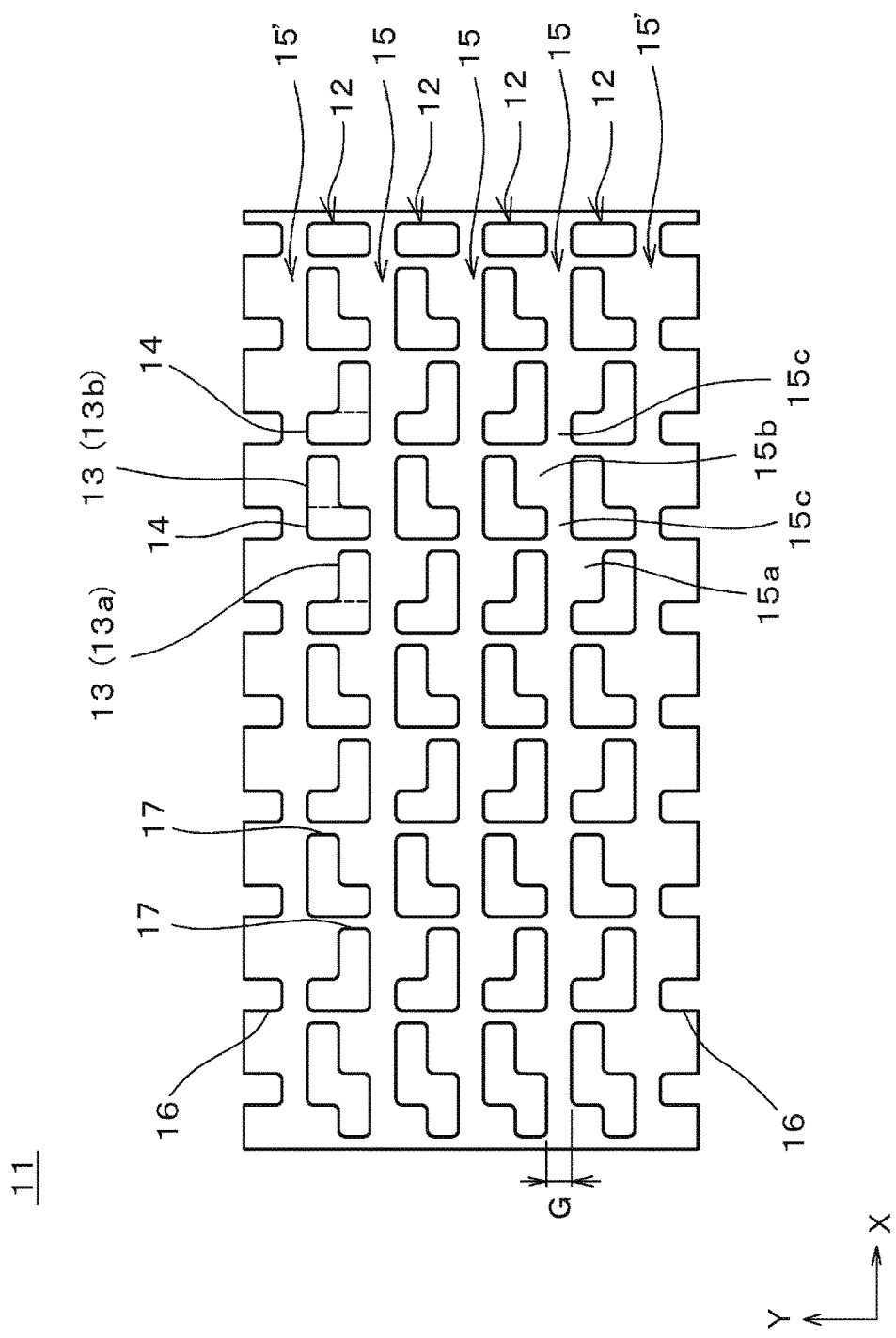
FIG. 9 is a view illustrating a sixth example of the print pattern of the printing plate of the first embodiment of the present disclosure.

The print pattern 11 in which a notch is provided in a part of the printing direction wall 13 can be used as illustrated in FIGS. 7 to 9.

For example, in the print pattern 11 of FIG. 7, a notch is provided in the center of the extended direction of the printing direction wall 13 so as to communicate the cell units 15 partitioned by the printing direction wall 13 with each other.

In the print pattern 11 of FIG. 8, the notch 17 is provided on the rear side of each printing direction wall 13 so as to communicate the cell units 15 with each other.

In the print pattern 11 of FIG. 9, the notch 17 is provided on the front side of each printing direction wall 13 so as to communicate the cell units 15 with each other.

In the configurations of FIGS. 7 to 9, a contact area between an edge portion of the printing direction wall 13 and the conductive paste P increases, so that an amount of conductive paste P supplied onto the printing direction wall 13 can be increased to surely generate the thread-forming spinnability.

The print pattern 11 in which the notch is provided in a part of the coupling wall 14 can also be used.

Figure 10:
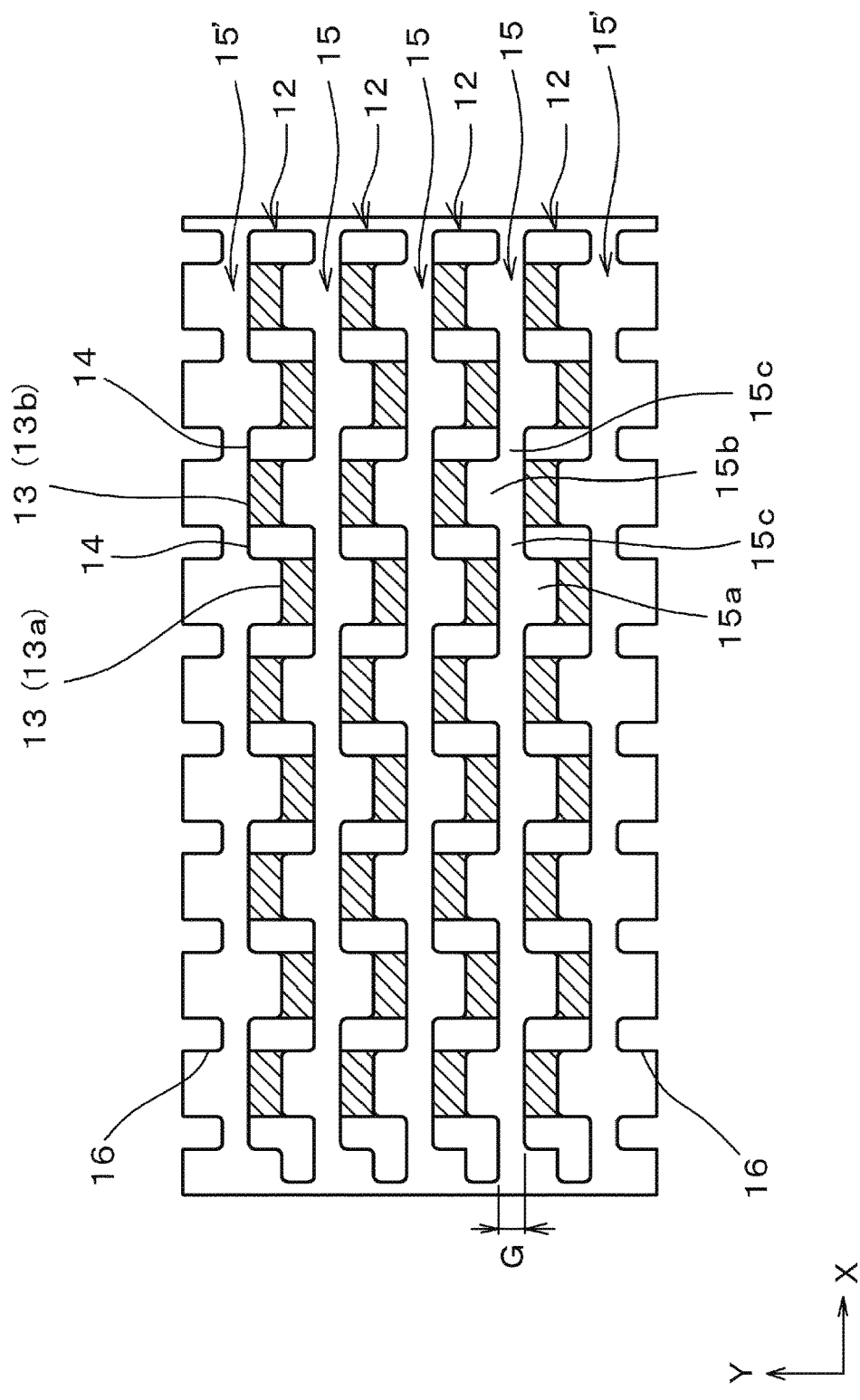
FIG. 10 is a view illustrating a seventh example of the print pattern of the printing plate of the first embodiment of the present disclosure.
Figure 11:
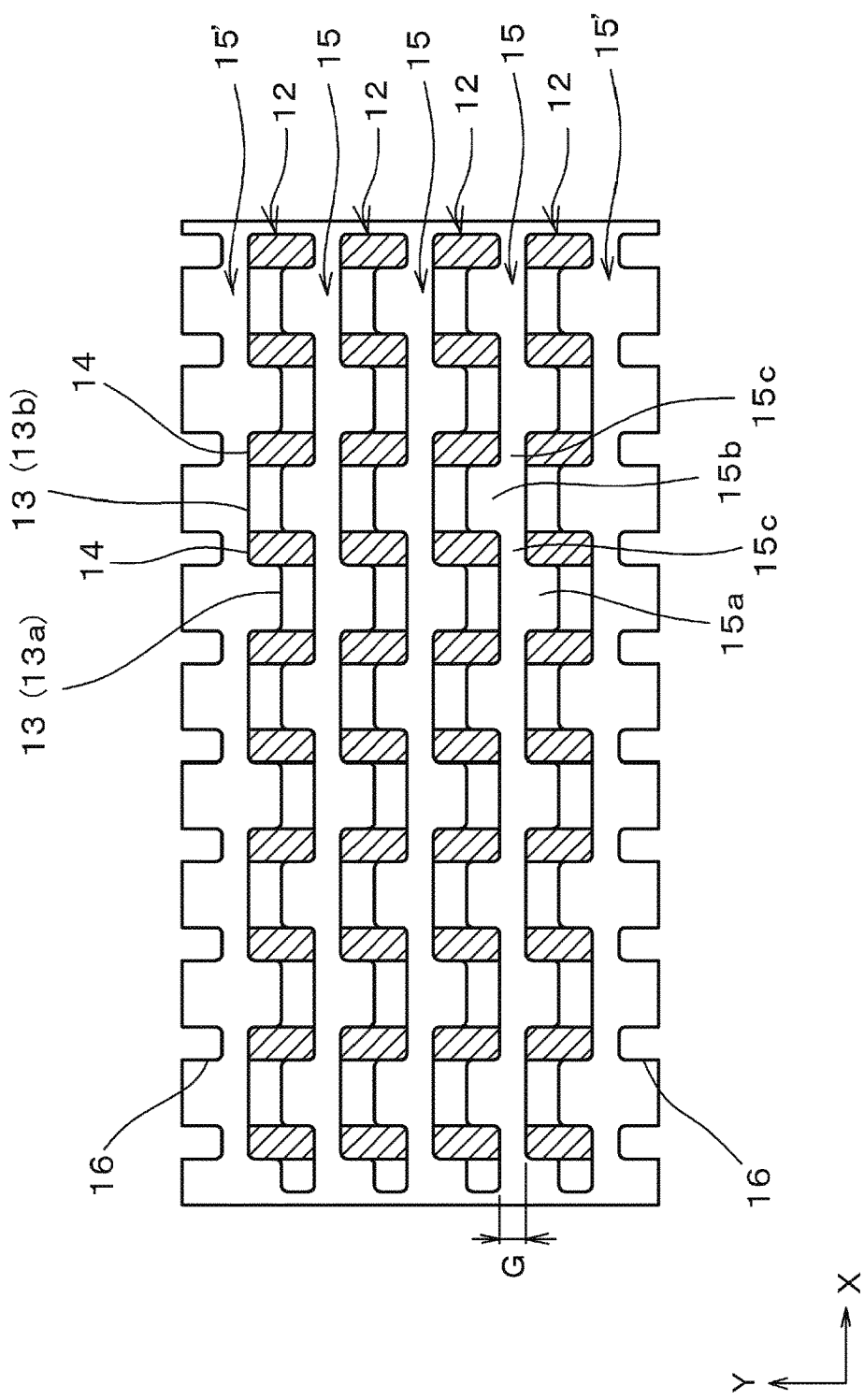
FIG. 11 is a view illustrating an eighth example of the print pattern of the printing plate of the first embodiment of the present disclosure.

The print pattern 11 in which a height of the partition wall 12 is partially lowered can be used as illustrated in FIGS. 10 and 11.

For example, in the print pattern 11 of FIG. 10, the height of the printing direction wall 13 is formed lower than the height of the outer circumferential surface of the gravure roll 51.

In the print pattern 11 of FIG. 11, the height of the coupling wall 14 is formed lower than the height of the outer circumferential surface of the gravure roll 51 by at least 0.5 µm.

A whole or part of the printing direction wall 13 or coupling wall 14 may be formed so as to be lowered.

In the configurations of FIGS. 10 and 11, the conductive paste P supplied onto the printing direction wall 13 or coupling wall 14, in which the height is lowered, is pressed against the article to be printed 1, and the transfer amount of conductive paste P can be increased.

Figure 12:
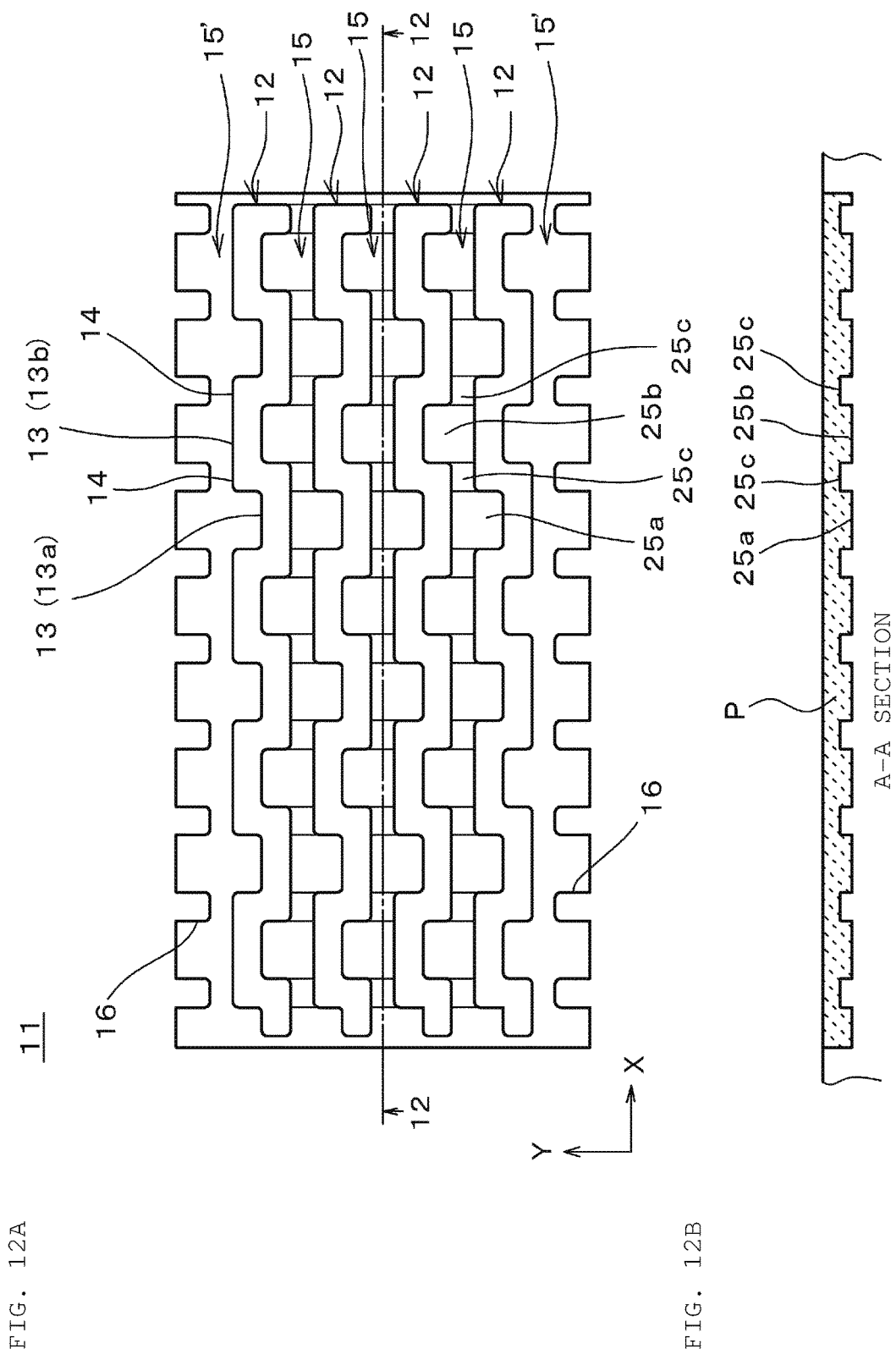
FIG. 12A is a plan view illustrating a ninth example of the print pattern of the printing plate of the first embodiment of the present disclosure.
FIG. 12B is a sectional view taken on a line 12-12 in FIG. 12A.

The print pattern 11 in which a shallow area 25c and deep areas 25a and 25b are alternately arranged along the printing direction X in each groove-shaped cell unit 15 formed between the adjacent partition walls 12 can also be used as illustrated in FIGS. 12A and 12B.

In the configurations of FIGS. 12A and 12B, the shallow area 25c that is located so as to partition the deep areas 25a and 25b acts as a dam to suppress an excess flow in the cell unit 15 of the conductive paste P, and a variation of the transfer amount can be suppressed in the printing direction X.

The use of the printing plate can form the graphic pattern (the conductive paste pattern for forming the internal electrode) having high accuracy in thickness and shape by printing the conductive paste on the ceramic green sheet or the carrier film. Therefore, the high-quality and high-reliability laminated ceramic electronic component (for example, the laminated ceramic capacitor in FIG. 13) can efficiently be produced.

(Second Embodiment)

Figure 13:
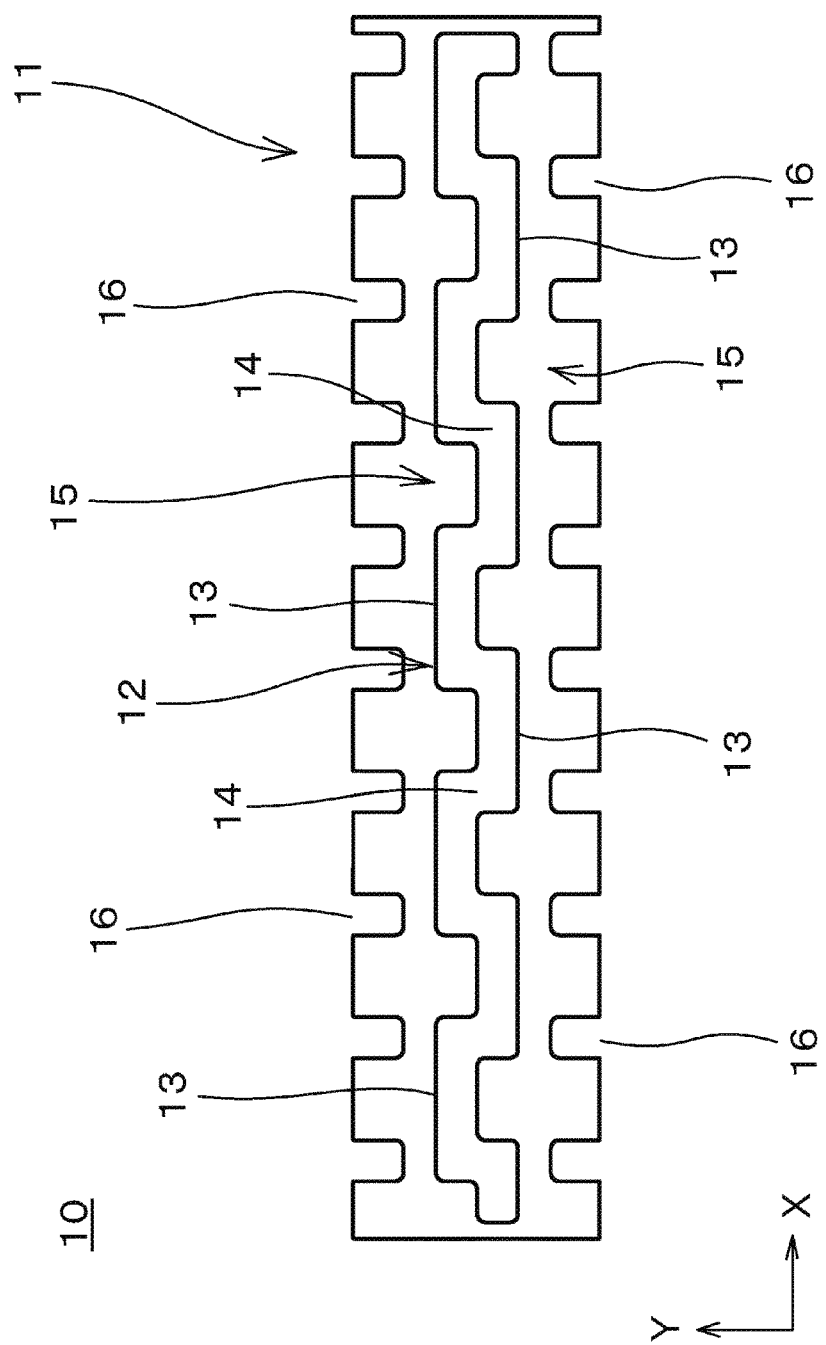
FIG. 13 is a view illustrating a print pattern of a printing plate according to a second embodiment of the present disclosure.

In the first embodiment, the printing plate includes the plural partition walls each of which includes the printing direction wall and the coupling wall, and the plural partition walls are arranged at predetermined intervals in the direction orthogonal to the printing direction. On the other hand, in a second embodiment, the printing plate 10 includes one partition wall 12 as illustrated in FIG. 13, and the groove-shaped cell units 15 are formed on both the sides of the partition wall 12. FIG. 13 illustrates one print pattern 11 constituting the printing plate 10 of the second embodiment.

As illustrated in FIG. 13, the print pattern 11 constituting the printing plate 10 of the second embodiment includes plural printing direction walls 13 and one partition wall 12. The plural printing direction walls 13 are arranged in the zigzag manner in the printing direction X. The partition wall 12 is arranged so as to couple the printing direction walls 13 adjacent to each other in the printing direction X, and the partition wall 12 includes the coupling wall 14 parallel to the orthogonal direction Y.

The two groove-shaped cell units 15 in each of which the printing paste is retained are formed on both sides of the partition wall 12 so as to be adjacent to each other with the partition wall 12 interposed therebetween.

The print pattern 11 constituting the printing plate 10 of the second embodiment includes plural end projection walls 16 that are arranged at predetermined intervals on both sides of the plural end projection walls 16 in the orthogonal direction Y.

The end projection walls 16 are arranged at the same position as the coupling wall 14 along the printing direction X or the end projection walls 16 are arranged so as to face the end projection walls 16 that face the end in the direction orthogonal to the printing direction X in the printing direction walls 13 arranged in the zigzag manner, which allows the periodical change amount of the cell width to be increased at the end along the printing direction X. Therefore, the transfer can be performed stably by continuously generating the thread-forming spinnability at the place where the cell width varies.

Even in the case that the printing plate 10 of the second embodiment is used, similarly to the case that the printing plate 10 of the first embodiment is used, in the printing process, the printing paste thread-forming spinnability formed between the partition wall 12 and the article to be printed can continuously be generated along the partition wall 12 when the printing plate 10 is separated from the article to be printed, and the shape accuracy, smoothness, thickness homogeneity of the graphic pattern such as the internal electrode pattern formed by printing the printing paste can be improved.

The printing plate 10 of the second embodiment includes the end projection wall 16, so that the continuous thread-forming spinnability can be generated stably at both the ends of the print pattern 11. Resultantly, the linearity can be improved at the end of the graphic pattern.

Because the print pattern 11 includes the one partition wall 12, the printing plate can be provided so as to form the small-size graphic pattern having excellent shape accuracy, smoothness, and thickness homogeneity.

Figure 14:
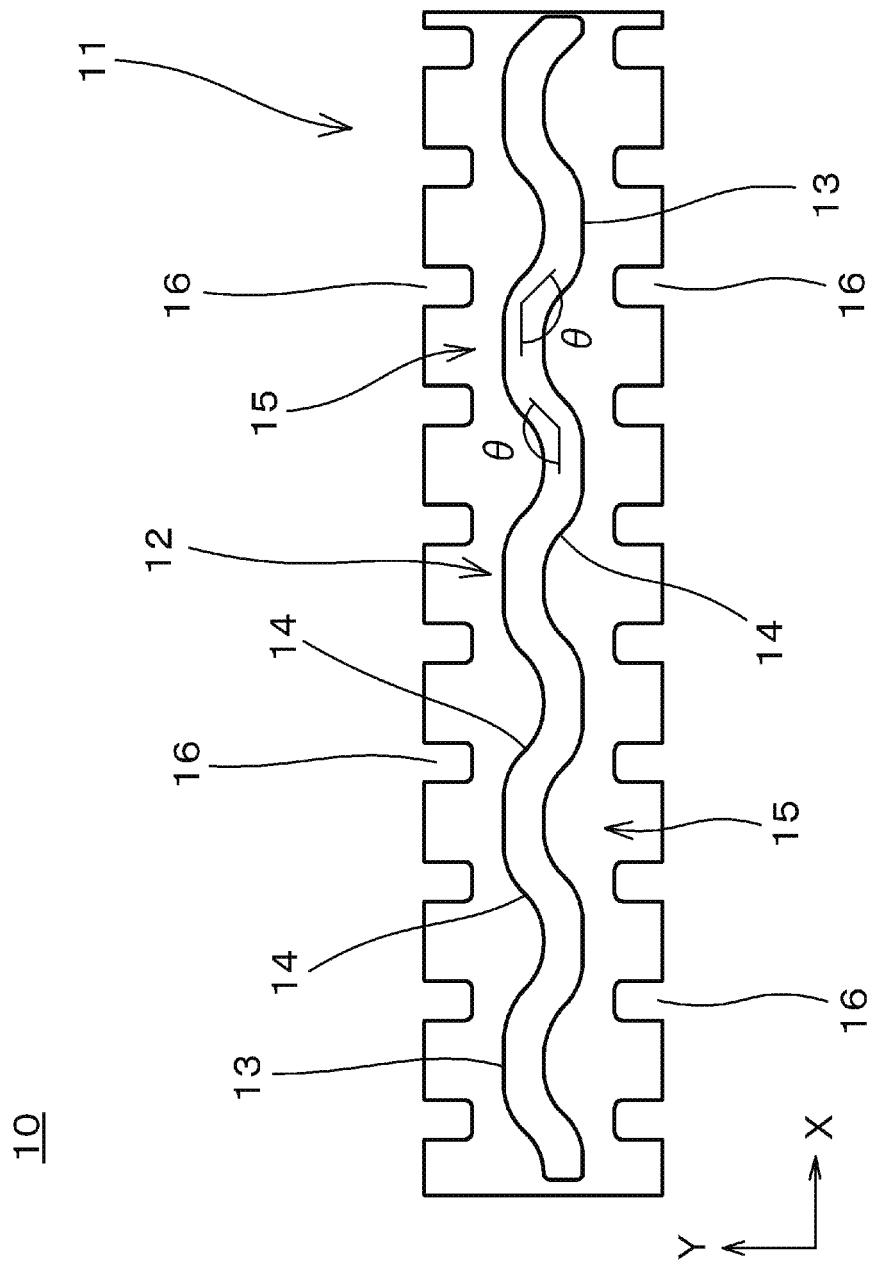
FIG. 14 is a view illustrating a modification of the print pattern of the printing plate of the second embodiment of the present disclosure.

FIG. 14 is a view illustrating a printing plate according to a modification of the second embodiment. FIG. 14 illustrates one print pattern 11 constituting the printing plate 10.

In the printing plate 10 of FIG. 11, in a plan view, the plural printing direction walls 13 arranged in the zigzag manner in the printing direction X are coupled to each other by the coupling wall 14 formed into the smoothly curved shape, thereby forming the partition wall 12.

In the printing plate 10 of FIG. 11, the coupling wall constituting the partition wall 12 is formed such that the minor angle θ in the angles formed by the center line of the extended direction of the coupling wall 14 and the center line of the extended direction of the direction wall 13 is greater than 90° and less than 180° (in FIG. 14, minor angle θ=135°).

Other configurations of the printing plate 10 of FIG. 11 are similar to those of the printing plate 10 of the second embodiment.

Even in the printing plate 10 of FIG. 14, similarly to the printing plate 10 (see FIG. 13) of the second embodiment, in the printing process, the printing paste thread-forming spinnability formed between the partition wall 12 and the article to be printed can continuously be generated along the partition wall 12 when the printing plate 10 is separated from the article to be printed, and the shape accuracy, smoothness, thickness homogeneity of the graphic pattern can be improved.

Because the minor angle θ is greater than 90° and less than 180° (in the configuration of FIG. 14, minor angle θ=135°) as described above, the thread-forming spinnability is allowed to proceed gently on the coupling wall 14, and the continuous thread-forming spinnability can stably be maintained.

Figure 15:
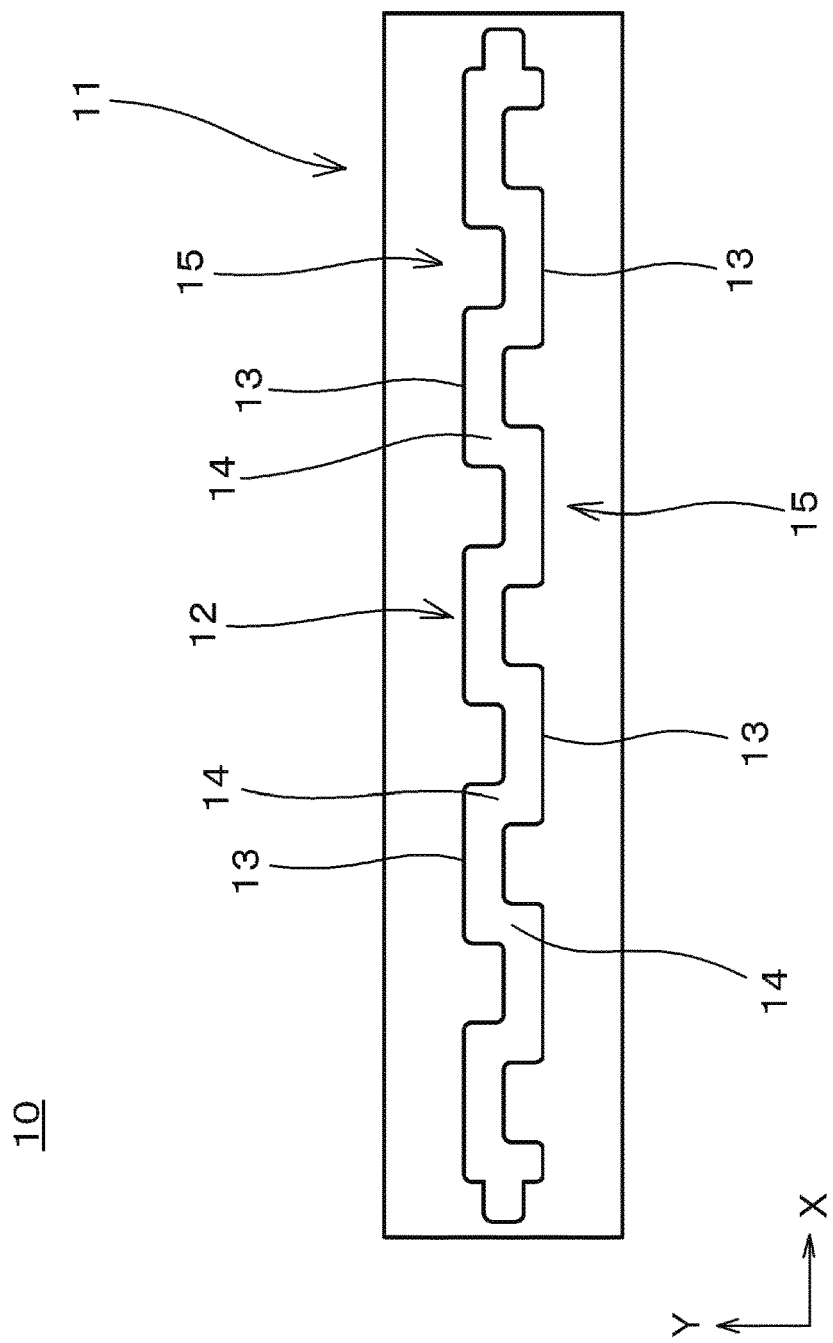
FIG. 15 is a view illustrating another modification of the print pattern of the printing plate of the second embodiment of the present disclosure.
Figure 16:
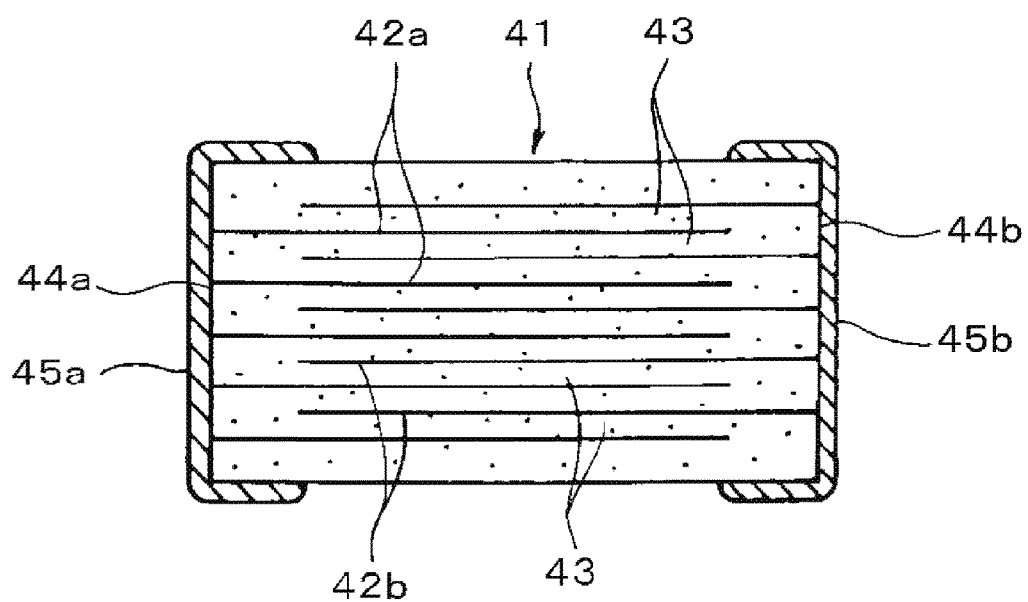
FIG. 16 is a sectional view illustrating a structure of a laminated ceramic capacitor.
Figure 17:
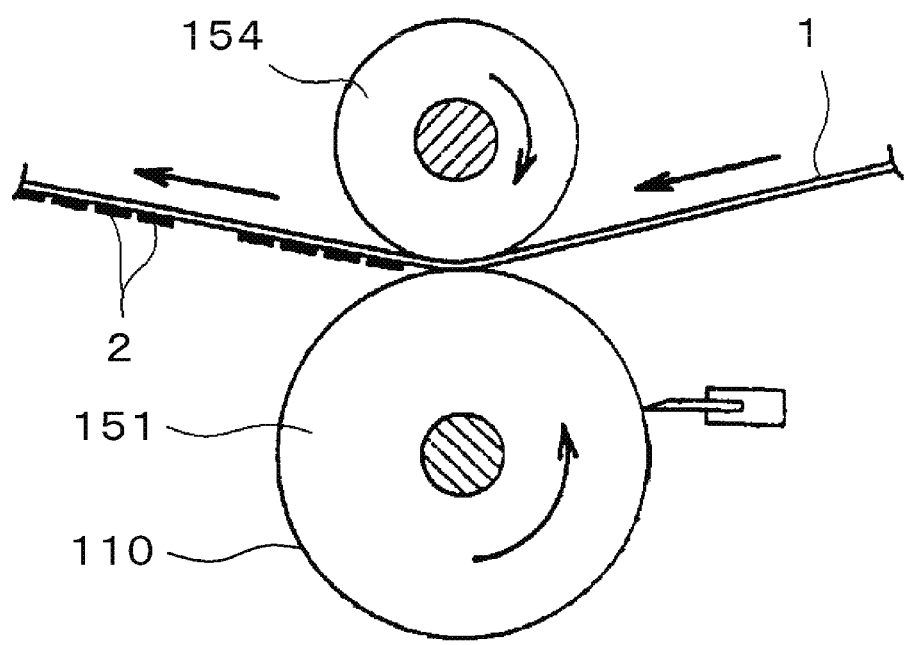
FIG. 17 is a view illustrating an outline of a gravure printing method.
Figure 18:
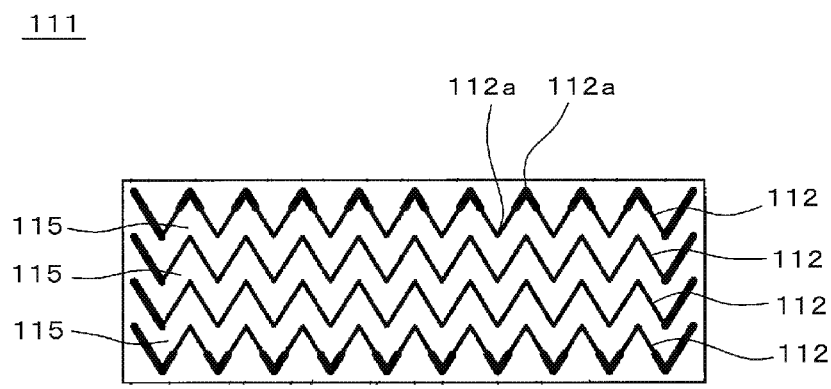
FIG. 18 is a view illustrating a print pattern of a conventional printing plate.

FIG. 15 is a view illustrating a printing plate (FIG. 13) according to another modification of the second embodiment. FIG. 15 illustrates one print pattern 11 constituting the printing plate 10.

The printing plate 10 of FIG. 15 differs from the printing plate 10 of the second embodiment in FIG. 13 in that the print pattern 11 constituting the printing plate 10 does not include the end projection wall 16 (see FIG. 13), and other configurations of the printing plate 10 of FIG. 15 are similar to those of the printing plate 10 of the second embodiment in FIG. 13.

Even if the print pattern 11 does not include the end projection wall, the print pattern 11 includes the single partition wall formed as described above, and the groove-shaped cell units are provided on both the sides of the print pattern 11. Therefore, the printing plate can be provided so as to form the small-size graphic pattern having excellent shape accuracy, smoothness, and thickness homogeneity.

In the above embodiments, the printing plate is used in printing the conductive paste for forming the internal electrode pattern for the laminated ceramic capacitor by way of example. However, the present disclosure can be applied in printing electrode patterns of various electronic components except for the laminated ceramic capacitor.

The printing plate of the present disclosure can be applied to not only the printing of the conductive paste but also the printing of various printing pastes such as a ceramic paste, a dielectric paste, and a resistive paste. Additionally, the printing plate of the present disclosure can be applied to the case in which the ceramic paste is printed to form the ceramic green sheet or the case in which the dielectric paste is printed to form a dielectric layer.

In the above embodiments, the rectangular pulse wave wall in which the printing direction walls are alternately arranged in the direction orthogonal to the printing direction is described as the partition wall by way of example. Alternatively, the partition wall of the present disclosure may be a wall that is formed in a stepwise manner along the printing direction. The stepwise wall having at least two steps may be formed so as to be periodically repeated along the printing direction.

In the above embodiments, the gravure roll is used as the printing plate by way of example. However, there is no limitation to the shape of the printing plate. For example, a flat printing plate in which the print pattern is formed in a flat plate material may be used.

In the above embodiments, the direct gravure printing method in which the printing plate for intaglio printing is used is described by way of example. However, the printing plate of the present disclosure can be used in general intaglio printing including offset printing.

For example, in the case that the offset printing is performed, an intermediate transfer body (for example, a blanket roll) is arranged so as to abut on both the printing plate and the article to be printed, and the printing paste filled in print pattern of the printing plate may be transferred to the article to be printed through the intermediate transfer body.

The present disclosure is not limited to the above embodiments. For example, various applications and modifications can be made without departing from the scope of the present disclosure with respect to the print pattern or the graphic pattern, the specific shape of the partition wall constituting the print pattern, the disposition number of partition walls constituting the print pattern, and a kind of the laminated ceramic electronic component produced through the process of printing the conductive paste on the ceramic green sheet or carrier film using the printing plate of the present disclosure and forming the graphic pattern for forming the internal electrode.

What is claimed is:

1. A printing plate for intaglio printing that obtains a predetermined graphic pattern by printing a printing paste on an article to be printed, said printing plate comprising:
    a plurality of periodic repeating print patterns corresponding to a periodic repeating graphic pattern to be printed being formed in a surface of a plate material,
    a predetermined direction along the surface of the plate material being configured to correspond to a printing direction of the article to be printed, and
    each of the plurality of print patterns including a plurality of partition walls and a groove-shaped cell unit, and each of the plurality of partition walls including a plurality of printing direction walls and a coupling wall,
    the plurality of partition walls being arranged at predetermined intervals in a direction orthogonal to the printing direction,
    the coupling wall being arranged so as to couple the printing direction walls adjacent to each other in the printing direction,
    the groove-shaped cell unit in which the printing paste is to be retained being provided between the partition walls adjacent to each other,
    wherein the plurality of printing direction walls define an area comprising a plurality of first portions and a plurality of second portions,
    wherein the area is provided in a plane defined by the printing direction and a direction orthogonal to the printing direction,
    wherein each of the plurality of first portions and the plurality of second portions is longer in the printing direction than the direction orthogonal to the printing direction when viewed in a plan view, and
    wherein the plurality of first portions is shifted in the direction orthogonal to the printing direction from the plurality of second portions.

2. The printing plate according to claim 1, wherein the plurality of printing direction walls are arranged parallel to each other at predetermined intervals in the direction orthogonal to the printing direction.

3. The printing plate according to claim 1, further comprising a plurality of end projection walls that are formed at at least one of ends of the print pattern in the direction orthogonal to the printing direction.

4. The printing plate according to claim 1, wherein the plate material is a cylindrical gravure roll, and the surface of the plate material is an outer circumferential surface of the gravure roll.

5. The printing plate according to claim 1, wherein the printing plate is formed in a flat plate material.

6. The printing plate according to claim 1, wherein the printing plate is an offset printing plate in which the printing paste is printed on the article to be printed from the printing plate through an intermediate transfer body.

7. The printing plate according to claim 1, wherein a cell width that is of a size in the direction orthogonal to the printing direction of the groove-shaped cell unit varies periodically along the printing direction.

8. The printing plate according to claim 1, wherein a main part of the printing direction wall is configured to be parallel to the printing direction.

9. The printing plate according to claim 1, wherein the coupling wall is formed such that a minor angle of angles formed by a center line of the coupling wall and a center line of the adjacent printing direction wall is greater than 90° and less than 180° in a plan view.

10. The printing plate according to claim 1, wherein a notch that communicates the cell units partitioned by the printing direction wall is formed in a part of the printing direction wall.

11. The printing plate according to claim 1, wherein a height of at least one of the printing direction wall and the coupling wall is lower than a height of the outer circumferential surface of the gravure roll.

* * * * *